US008704315B2

(12) United States Patent
Parpia et al.

(10) Patent No.: US 8,704,315 B2
(45) Date of Patent: Apr. 22, 2014

(54) CMOS INTEGRATED MICROMECHANICAL RESONATORS AND METHODS FOR FABRICATING THE SAME

(75) Inventors: Jeevak M. Parpia, Ithaca, NY (US); Harold G. Craighead, Ithaca, NY (US); Joshua D. Cross, Ithaca, NY (US); Bojan Robert Ilic, Ithaca, NY (US); Maxim K. Zalalutdinov, Silver Spring, MD (US); Jeffrey W. Baldwin, Alexandria, VA (US); Brian H. Houston, Fairfax, VA (US)

(73) Assignee: Cornell University, Ithaca, NY (US)

( * ) Notice: Subject to any disclaimer, the term of this patent is extended or adjusted under 35 U.S.C. 154(b) by 516 days.

(21) Appl. No.: 13/000,650

(22) PCT Filed: Jun. 26, 2009

(86) PCT No.: PCT/US2009/048835
§ 371 (c)(1),
(2), (4) Date: Dec. 22, 2010

(87) PCT Pub. No.: WO2010/039307
PCT Pub. Date: Apr. 8, 2010

(65) Prior Publication Data
US 2011/0101475 A1    May 5, 2011

Related U.S. Application Data

(60) Provisional application No. 61/075,773, filed on Jun. 26, 2008, provisional application No. 61/075,855, filed on Jun. 26, 2008.

(51) Int. Cl.
*H01L 29/82* (2006.01)

(52) U.S. Cl.
USPC ............... 257/415; 257/254; 257/E29.324

(58) Field of Classification Search
USPC .............. 73/704; 257/19, 254, 415, E29.324; 438/22, 50, 52; 977/724, 726, 732
See application file for complete search history.

(56) References Cited

U.S. PATENT DOCUMENTS

| 4,188,557 | A  | * | 2/1980 | Mattuschka ................. 310/368 |
| 5,808,210 | A  | * | 9/1998 | Herb et al. ................. 73/862.59 |
| 6,182,513 | B1 | * | 2/2001 | Stemme et al. ................. 73/704 |
| 6,210,988 | B1 | * | 4/2001 | Howe et al. ..................... 438/50 |
| 6,379,623 | B1 | * | 4/2002 | Mays, Jr. .................. 422/82.08 |
| 6,557,419 | B1 | * | 5/2003 | Herb et al. ....................... 73/766 |
| 2002/0063497 | A1 | * | 5/2002 | Panasik ......................... 310/364 |
| 2002/0096967 | A1 | * | 7/2002 | Ma et al. ...................... 310/309 |

(Continued)

*Primary Examiner* — Hoai V Pham
(74) *Attorney, Agent, or Firm* — William Greener; Alek P. Szecsy; Bond, Schoeneck & King, PLLC

(57) ABSTRACT

The present invention is directed to a CMOS integrated micromechanical device fabricated in accordance with a standard CMOS foundry fabrication process. The standard CMOS foundry fabrication process is characterized by a predetermined layer map and a predetermined set of fabrication rules. The device includes a semiconductor substrate formed or provided in accordance with the predetermined layer map and the predetermined set of fabrication rules. A MEMS resonator device is fabricated in accordance with the predetermined layer map and the predetermined set of fabrication rules. The MEMS resonator device includes a micromechanical resonator structure having a surface area greater than or equal to approximately 20 square microns. At least one CMOS circuit is coupled to the MEMS resonator member. The at least one CMOS circuit is also fabricated in accordance with the predetermined layer map and the predetermined set of fabrication rules.

30 Claims, 10 Drawing Sheets

(56) References Cited

U.S. PATENT DOCUMENTS

| | | | |
|---|---|---|---|
| 2005/0162040 A1* | 7/2005 | Robert | 310/322 |
| 2005/0179508 A1* | 8/2005 | Sato | 333/187 |
| 2007/0091971 A1 | 4/2007 | Tanaka | |
| 2007/0281381 A1 | 12/2007 | Ayazi | |
| 2008/0128901 A1 | 6/2008 | Zurcher et al. | |
| 2008/0150647 A1* | 6/2008 | Yang et al. | 331/154 |

* cited by examiner

CMOS INTEGRATED MICROMECHANICAL RESONATORS AND METHODS FOR FABRICATING THE SAME

CROSS-REFERENCE TO RELATED APPLICATIONS

This is application claims the benefit of priority under 35 U.S.C. §119(e) to U.S. Provisional Patent Application Ser. No. 61/075,855 filed on Jun. 26, 2008 and U.S. Provisional Patent Application Ser. No. 61/075,773 filed on Jun. 26, 2008, the contents of which is relied upon and incorporated herein by reference in their entirety.

GOVERNMENT SPONSORSHIP

This invention was made with Government support under: Contract No. N0001408WX30004 awarded by the Office of Naval Research (ONR); and Grant No. HR0011-06-1-0042 awarded by the Department of Defense, specifically DARPA. The Government has certain rights in the invention.

BACKGROUND OF THE INVENTION

1. Field of the Invention

The present invention relates generally to fabricating micromechanical semiconductor devices, and particularly to MEMS/NEMS devices using standard CMOS fabrication processes.

2. Technical Background

The performance of radio frequency (RF), wireless, signal processing and other such electronic systems depends in part on the accuracy and stability of the reference clock signals employed in the aforementioned systems. System clock and timing signals are typically derived from a reference clock signal that is generated by a reference oscillator. The key component of an oscillator is a device known as a resonator. As the name suggests, the device resonates in response to an input stimulus and provides a reference frequency signal corresponding to the resonant frequency. Many of state-of-the-art oscillators employ quartz resonators.

On the other hand, resonators based on MEMS technology are currently being investigated for the next generation of system applications because of the inadequacies associated with quartz resonators. Some of the characteristics that designers desire in resonators and reference oscillators include high frequency, high quality factor (Q), a small physical footprint, minimal power consumption, a wide tuning range, and low phase noise. Further, the ability to monolithically integrate MEMS/NEMS mechanical resonators, transducers and the like within conventional CMOS circuitry is highly desirable.

Until recently, designers have considered three general approaches for integrating MEMS devices and CMOS circuits. The first approach is referred to herein as "pre-MEMS" and employs a standard MEMS fabrication sequence first and follows with a CMOS transistor fabrication process. The second method is essentially the reverse of the first approach and is referred to herein as "post-MEMS." The CMOS transistor fabrication process is performed and the MEMS device fabrication sequence follows thereafter. Essentially, the drawback associated with each of these approaches is that they require two foundry sequences to complete the device fabrication. The negative cost implications are obvious.

The third approach under consideration is referred to herein as "MEMS-in-the middle" because one or more MEMS process steps are performed in the middle of the CMOS transistor fabrication process. In other words, the CMOS fabrication process is customized to include process steps for fabricating the MEMS devices. One drawback to this approach is that the standard CMOS foundry process must be modified to include non-standard MEMS process sequences. This may require a significant re-tooling and/or modification of the CMOS foundry and directly translates to higher costs. The costs may be prohibitive because a given CMOS foundry may be unwilling to make the modifications in light of their obligations to their customer base. The disruptions to the foundry's work flow may not be worth the trouble.

In the methods described above, the integration of MEMS/NEMS devices and CMOS circuits has not been effectively realized because of incompatibilities with MEMS/NEMS processes and standardized CMOS foundry processes. At this point, it may be helpful to the reader to explain what the term "standard CMOS foundry process" means. A standard CMOS process refers to a predefined sequence of "unit processes" required to fabricate a CMOS integrated circuit. Each unit process may include several fabrication steps. A series of unit processes may be employed as an "integration module" to obtain a desired circuit feature. For example, a transistor gate structure may be fabricated using a predefined "gate module." The overall CMOS process, therefore, includes a defined sequence of integrated modules that may be specified using a "layer map." Accordingly, CMOS foundries offer standard CMOS fabrication processes that are specified using predefined, layer maps to accommodate the needs of most of its customers.

By way of example, MOSIS is a low-cost prototyping and small-volume production service for VLSI circuit development. It provides its customers with layer maps that include a well defined set of rules and options that must be followed when submitting a design. MOSIS provides a document that defines the official MOSIS scalable CMOS (SCMOS) layout rules. The user will provide the MOSIS fabrication facility with a design specification in accordance with the map. The SCMOS Layer map is reproduced in Table I as an example of a "standard CMOS foundry process." Table I illustrates the standardized layer map that defines the CMOS process integration flow.

TABLE I

Example SCMOS Layer Map

| Layer | Rule Section | Notes |
|---|---|---|
| N WELL | 1 | |
| P WELL | 1 | SCPxx |
| CAP WELL | 17, 18 | SCN3MLC |
| ACTIVE | 2 | |
| THICK ACTIVE | 24 | SCN4M (TSMC only), SCN4ME, SCN5M, SCN6M |
| PBASE | 16 | SCNA |
| POLY CAP1 | 23 | SCNPC |

TABLE I-continued

Example SCMOS Layer Map

| Layer | Rule Section | Notes |
|---|---|---|
| POLY | 3 | |
| SILICIDE BLOCK | 20 | SCN3M, SCN4M (TSMC only), SCN5M, SCN6M |
| N PLUS SELECT | 4 | |
| P PLUS SELECT | 4 | |
| POLY2 | 11, 12, 13 | SCNE, SCNA, SCN3ME, SCN4ME |
| HI RES IMPLANT | 27 | SCN3ME |
| CONTACT | 5, 6, 13 | |
| POLY CONTACT | 5 | Can be replaced by CONTACT |
| ACTIVE CONTACT | 6 | Can be replaced by CONTACT |
| POLY2 CONTACT | 13 | SCNE, SCNA, SCN3ME, SCN4ME Can be replaced by CONTACT. |
| METAL1 | 7 | |
| VIA | 8 | |
| METAL2 | 9 | |
| VIA2 | 14 | SCN3M, SCN3ME, SCN3MLC, SCN4M, SCN4ME, SCN5M, SCN6M |
| METAL3 | 15 | SCN3M, SCN3ME, SCN3MLC, SCN4M, SCN4ME, SCN5M, SCN6M |
| VIA3 | 21 | SCN4M, SCN4ME, SCN5M, SCN6M |
| METAL4 | 22 | SCN4M, SCN4ME, SCN5M, SCN6M |
| CAP TOP METAL | 28 | SCN5M. SCN6M |
| VIA4 | 25 | SCN5M, SCN6M |
| METAL5 | 26 | SCN5M, SCN6M |
| VIA5 | 29 | SCN6M |
| METAL6 | 30 | SCN6M |
| DEEP N WELL | 31 | SCN5M, SCN6M |
| GLASS | 10 | |
| PADS | | Optional non-fab layer used solely to highlight the bonding pads. |

Each layer depicted above has associated with it predefined rules (column two) and technology codes (column three). Essentially, the layer map specifies the film stack for the CMOS circuit. Those of ordinary skill in the art will understand that there are other standard foundry CMOS processes including the Austriamicrosystems, IBM, TSMC fabrication processes, etc.

Recently, an approach for integrating MEMS/NEMS devices and CMOS circuits using standard CMOS fabrication processes has been under consideration. In this approach, certain MEMS structures such as bridges and cantilevers may be fabricated using a standard CMOS foundry process. However, the bridge and cantilever structures that may be fabricated by the contemplated method are very small. In one design currently under consideration, portions of the bridge on either side of the transverse bridge center-line are removed such that the capacitive detection plates are formed by the cross-sectional edges of the bridge along the cut-lines bisecting the bridge in the transverse direction. The drawbacks associated with this proposed method are that the capacitor pick-up surfaces are disposed "in-plane." Another drawback relates to the fact that the surface area for capacitive pick-up is on the order of about 1 $\mu m^2$. The transverse cut-lines described above must be relatively small to obtain the required gap for the capacitive detector. In fact, the size of the detector gap becomes a function of the linewidth of the illumination source in the photolithographic process. As the linewidth becomes smaller, more sophisticated (and hence, more expensive) illumination assemblies are required. Another drawback of the standard CMOS process under consideration relates to the fabrication of a MEMS device and its subsequent release. The MEMS device would be fabricated such that there is very little internal stress in the device such that its rigidity is relatively low. After the device is fabricated using the standard foundry process, the MEMS device would be exposed to gain access thereto. At this point, the region under the bridge span would be filled with an oxide material that must be removed by wet-etching. Unfortunately, when the etchant evaporates, it has a tendency to introduce a suction force such that the bridge is forced downwardly and sticks to the underlying substrate. When this occurs in any MEMS release process, the device does not release. This phenomenon is known as stiction. Accordingly, MEMS devices that may be fabricated using this technique would have a very low yield rate.

As noted above, stiction is often an issue in standard MEMS devices (i.e., those devices fabricated using standard non-CMOS techniques). In order to solve the stiction problem, those of ordinary skill in the art often resort to what is known as a "critical point dry" technique whereby liquid carbon-dioxide is introduced to replace the wet etchant before evaporation occurs. Subsequently, the liquid carbon-dioxide reverts to its gaseous state such that the stiction forces are not introduced. While this additional step may be used to improve the yield of the standard CMOS approach currently under consideration, it has several drawbacks. First, it is relatively expensive. Second, it introduces additional non-CMOS steps into the back end of the process. Accordingly, it defeats the very purpose of using a standard CMOS foundry process to produce MEMS devices; i.e., to avoid expensive post fabrication processing.

What is needed, therefore, is an improved method for integrating MEMS/NEMS devices and CMOS circuits using a standard CMOS foundry process. An improved process is needed such that the MEMS devices are characterized by improved actuation and detection capabilities, lower power consumption, and a greater yield, without the need for post fabrication stiction-inhibiting processes.

SUMMARY OF THE INVENTION

The present invention addresses the needs described above by providing an improved method for integrating MEMS/NEMS devices and CMOS circuits using a standard CMOS foundry process. An improved process is needed such that the MEMS devices are characterized by improved actuation and detection capabilities, lower power consumption, and a greater yield, without the need for post fabrication stiction-inhibiting processes.

One aspect of the present invention is directed to a method for making a CMOS integrated micromechanical device. The method includes the step of selecting a standard CMOS foundry fabrication process, the standard CMOS foundry fabrication process being characterized by a predetermined layer map and a predetermined set of fabrication rules. A semiconductor substrate is provided in accordance with the predetermined layer map and the predetermined set of fabrication rules. A layer of field oxide material is formed over the semiconductor substrate in accordance with the predetermined layer map and the predetermined set of fabrication rules. The field oxide material forms a double-tapered profile around a predefined perimeter. The field oxide material is conformally coated with at least one layer of thin-film material to form a film-stack in accordance with the predetermined layer map and the predetermined set of fabrication rules. The film stack is configured as a MEMS resonator device. CMOS electronics elements are formed in accordance with the predetermined layer map and the predetermined set of fabrication rules. The previous method steps are not necessarily performed sequentially, but these steps are performed during the standard CMOS foundry fabrication process. The field oxide layer or an interpoly oxide layer are removed to form a MEMS resonator device after the previous steps are completed. The step of removing is configured to release the MEMS resonator device such that at least a portion of the MEMS resonator device flexes upwardly and away from the semiconductor substrate in conformance with the double-tapered profile. The MEMS resonator device is characterized by a predetermined mechanical resonance frequency.

In another aspect, the present invention is directed to a CMOS integrated micromechanical device fabricated in accordance with a standard CMOS foundry fabrication process, the standard CMOS foundry fabrication process being characterized by a predetermined layer map and a predetermined set of fabrication rules. The device includes a semiconductor substrate formed or provided in accordance with the predetermined layer map and the predetermined set of fabrication rules. A MEMS resonator device is fabricated in accordance with the predetermined layer map and the predetermined set of fabrication rules. The MEMS device includes a first layer of thin film material disposed over the semiconductor substrate. The first layer of thin film material conforms to a predetermined geometric configuration around a predetermined perimeter. The predetermined perimeter is characterized by a double-tapered interface whereby a portion of the semiconductor substrate is tapered downwardly to form a depressed region within the predetermined geometric configuration and the first layer of thin film material is tapered upwardly and away from the semiconductor substrate. A second layer of thin film material is conformally deposited over the first layer of thin film material. The second layer of thin film material also conforms to a predetermined geometric configuration. The first layer of thin film material and second layer of thin film material, or only the second layer of thin film material, are flexed away from the semiconductor substrate to form a MEMS resonator member. The resonator member is characterized by a predetermined mechanical resonance frequency. At least one CMOS circuit is coupled to the MEMS resonator member. The at least one CMOS circuit is fabricated in accordance with the predetermined layer map and the predetermined set of fabrication rules.

In yet another aspect, the present invention is directed to a CMOS integrated micromechanical device fabricated in accordance with a standard CMOS foundry fabrication process. The standard CMOS foundry fabrication process is characterized by a predetermined layer map and a predetermined set of fabrication rules. The device includes a semiconductor substrate formed or provided in accordance with the predetermined layer map and the predetermined set of fabrication rules. A MEMS resonator device is fabricated in accordance with the predetermined layer map and the predetermined set of fabrication rules. The MEMS resonator device includes a micromechanical resonator structure having a surface area greater than or equal to approximately 20 square microns. At least one CMOS circuit is coupled to the MEMS resonator member. The at least one CMOS circuit is also fabricated in accordance with the predetermined layer map and the predetermined set of fabrication rules.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 5:
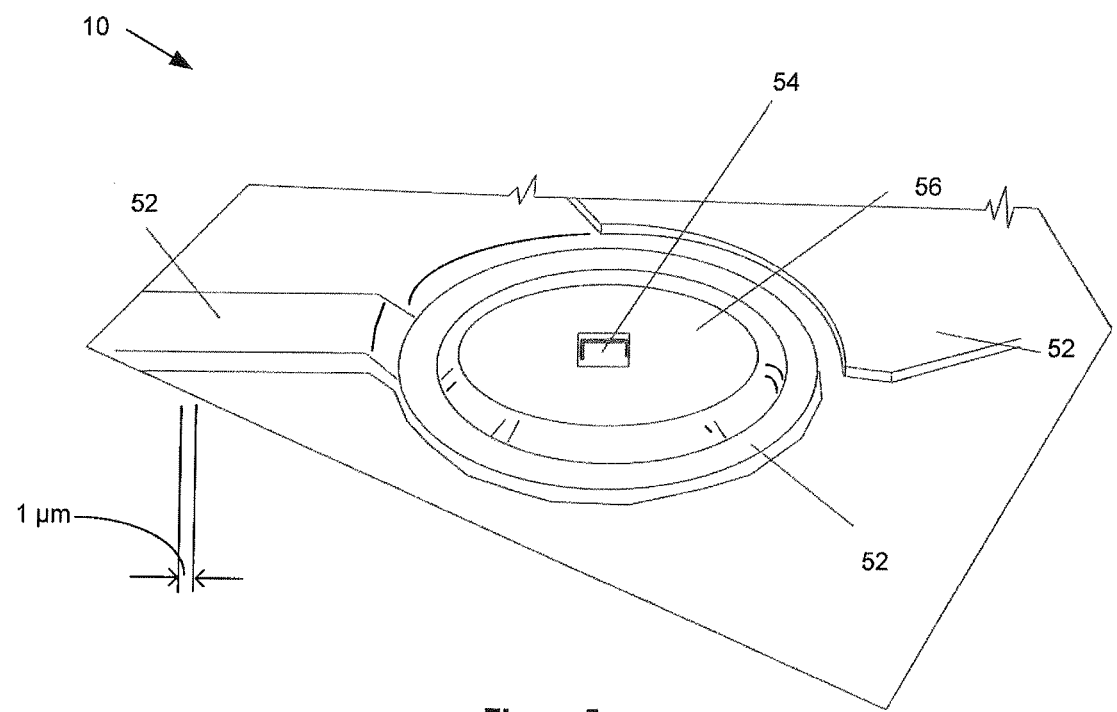
FIG. 5 is a perspective view of a capacitively detected resonator dome structure fabricated in accordance with an embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the resonator device of the present invention is shown in FIG. 5, and is designated generally throughout by reference numeral 10.

Figure 1:
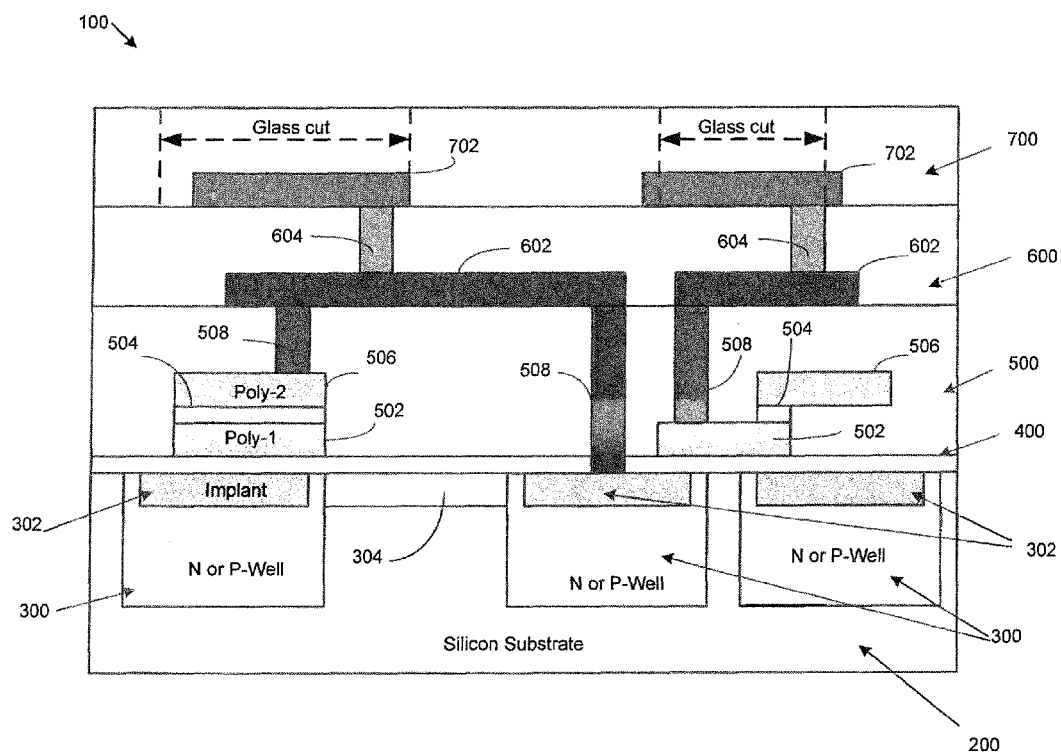
FIG. 1 is a cross-sectional schematic of the film stack of the AMIS ABN 1.5 µm fabrication process.

As embodied herein, and depicted in FIG. 1, a cross-sectional schematic of the standard film stack for the AMIS ABN 1.5 µm fabrication process is depicted. The film stack shown in FIG. 1 corresponds, of course, to a standard layer map much like the one depicted in Table 1 above. The AMIS ABN 1.5 µm film stack is a two metal layer, two polysilicon layer film stack.

Proceeding from bottom to top, layer 200 corresponds to a silicon substrate. Once the silicon substrate 200 is provided, wells 300 are formed therein. The wells are formed by applying a layer of photoresist to predetermined areas of the surface of the substrate 300. Those regions that correspond to the wells do not have the photoresist material applied thereto. Depending on the user design, a diffusion of donor atoms is applied to the surface to create either p-type wells or n-type wells. After etching, a layer of field oxide (FOX) 304 may be disposed between wells 300 to provide isolation. Subsequently, n+ and p+ implants 302 may be disposed in n-type wells and p-type wells, respectively. The next step in the standard process is to apply a layer of gate oxide (GOX) 400 as shown in FIG. 1. A first layer of undoped polysilicon 502 and a second layer of undoped polysilicon 506 are disposed at appropriate locations over the GOX layer 400. A layer of interpoly oxide 504 is deposited between polysilicon layer 502 and polysilicon layer 506 to form a double-polysilicon film stack.

A layer of glass insulator material 500 is disposed over the layers of polysilicon and metal contacts are formed therein. Subsequently, the various first metal layers 602 are laid down over the insulator 500 to interconnect the contacts 508 as appropriate. A second layer of insulator material 600 is deposited over the first metal layers 602. Vias 604 are formed by removing a portion of the insulator material 600. The vias 604 are typically formed using tungsten plugs. The second metal layers 702 are formed over the insulator layer 600 and provide an interconnection means for the vias 604. Subsequently, a third layer of glass insulator 700 is disposed over the second metal layers 702. A portion of the glass insulator 700 is removed by a glass cut such that access to portions of the second metal layer 702 are provided.

It must be emphasized that the film stack depicted in FIG. 1 does not show any particular CMOS circuit element or any particular MEMS device. The double-polysilicon film stack (502, 504, 506) shown on the left hand side of FIG. 1 may be used to form a capacitor. The twin wells 300 and the polysilicon layer 502 disposed on the right hand side of FIG. 1 may be employed by the standard AMIS ABN 1.5 µm fabrication process to fabricate a transistor. The polysilicon layer 506 on the right hand side may be used as a resistor element.

With the generic film stack (FIG. 1) representing the AMIS ABN 1.5 µm fabrication process firmly in mind, it must be emphasized that any suitable standard CMOS foundry fabrication process may be employed to design and fabricate CMOS-MEMS/NEMS with CMOS circuits in accordance with the teachings of the present invention.

Figure 2:
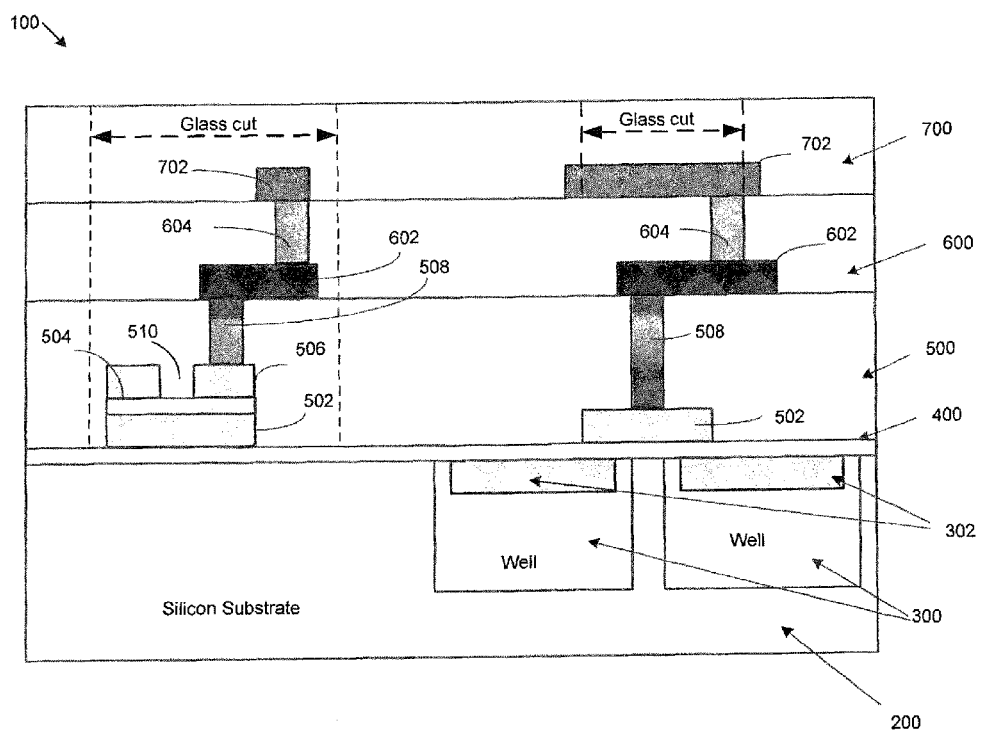
FIG. 2 is a cross-sectional schematic of the film stack of the AMIS ABN 1.5 µm fabrication process depicted in FIG. 1 illustrating a method for integrating a CMOS MEMS device and a CMOS electronic device.

Referring to FIG. 2, a cross-sectional schematic of the film stack of the AMIS ABN 1.5 µm fabrication process depicted in FIG. 1 illustrating a method for integrating a CMOS MEMS device and a CMOS electronic device is disclosed. FIG. 2 illustrates how the standard AMIS ABN 1.5 µm fabrication process depicted in FIG. 1 may be employed to integrate a CMOS MEMS device with CMOS electronic circuitry. Referring to the left hand side of the drawing, the polysilicon layers (502, 506) are again sandwiched together with the layer of interpoly oxide 504 disposed therebetween to faun the double-polysilicon film stack (502, 504, 506). An aperture 510 may be formed in the top polysilicon layer 506 during the process of patterning the polysilicon layer 506. The aperture 510 is in contact with the interpoly oxide material 504. Contacts 508 are coupled to the double-polysilicon film stack (only one contact 508 is depicted as being connected to the double-polysilicon film stack for clarity of illustration). The contacts 508 are connected to the first metal layer 602 in the manner described above. Vias 604 are also disposed between the first metal layer 602 and the second metal layer 702 in the manner previously described.

On the right hand side of FIG. 2, the standard AMIS ABN 1.5 µm fabrication process accommodates the fabrication of a transistor structure. Again, well structures 300 are formed in the silicon substrate to provide n-type or p-type regions that ultimately will be connected to source and drain contacts 508 (not shown in FIG. 2 for clarity of illustration). The first polysilicon layer 502 is used to form the gate of the transistor. The gate 502 may be connected to other circuits via contact structures 508 and the first metal layer 602. Of course, external connections to the pins of the integrated circuit (IC) are provided by vias 604 and the second metal layer 702. Reference is made to U.S. Pat. No. 3,356,858, which is incorporated herein by reference as though fully set forth in its entirety, for a more detailed explanation of basic CMOS devices such as transistors (n-type and p-type), inverters, and various logic gates such as NAND and NOR gates.

The implementation of the tungsten vias and the second layer of metallization 702 are typically referred to as back-end-of-the-line (BEOL) process steps. Another BEOL step is the glass cut shown in both FIG. 1 and FIG. 2. The glass cut typically provides access to the second metallization layer 702 such that interconnections between the IC pins and the internal circuits may be implemented. The left-hand side of the stylized diagram of FIG. 2 shows that the glass cut may advantageously be employed to provide access to the polysilicon sandwich (502, 504, 506) previously described. Once access is provided, hydrofluoric acid or a buffered oxide etch is applied to remove the interpoly oxide material 504 or the field oxide 304 depending on the configuration of the film stack. As will be explained in greater detail below, the removal of the silicon dioxide insulator material is one of the final steps in forming CMOS-MEMS resonator structure. The removal of the oxide material "releases" the resonator structure 10. This illustrates another advantageous feature of the present invention; the oxide material may be tailored and removed where needed to within the lithography limits of the CMOS process.

Again, the method depicted in FIG. 2 strictly employs the standard AMIS ABN 1.5 µm fabrication process without deviations. This process is available for multi-project fabrication runs through MOSIS, and the inventors have used the MOSIS service to fabricate a double-poly resonator structures as described herein. Those of ordinary skill in the art will understand that while the process steps depicted in FIGS. 1 and 2 employ the AMIS ABN 1.5 µm fabrication process, any standard foundry CMOS process may be employed in accordance with the teachings of the present invention.

FIGS. 3A-3D are detail views illustrating a fabrication technique employed in the CMOS-MEMS process in accordance with various embodiments of the present invention.

Figure 3A:
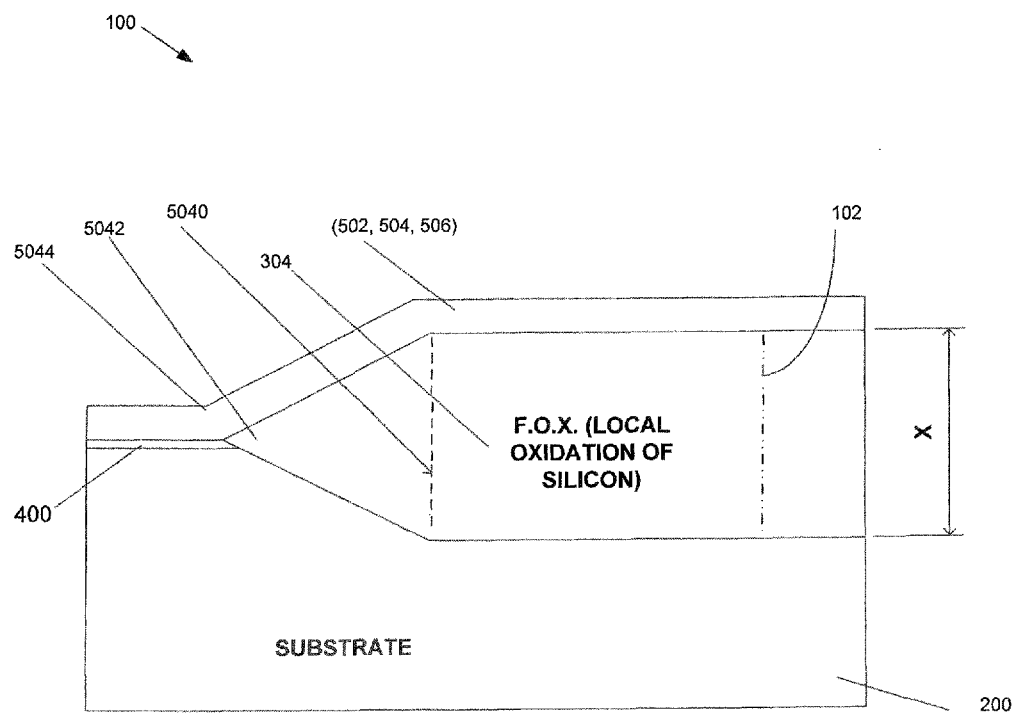
FIGS. 3A-3D are detail views illustrating a fabrication technique employed in the CMOS-MEMS process in accordance with various embodiments of the present invention.

Referring to FIG. 3A, a detail view of a polysilicon film stack in accordance with an embodiment of the present invention is disclosed. In this embodiment, the polysilicon film stack includes either polysilicon layer 502, interpoly oxide 504 and/or polysilicon layer 506 deposited over a layer of field oxide (FOX) 304 in accordance with the various embodiments of the present invention described herein. Thus, the resonator structure 100 may also be fabricated using one, two or three layers, again, in accordance with the various embodiments of the present invention described herein. The drawing of FIG. 3A is not to scale, dimension X is variable but may be on the order of a micron.

The FOX layer 304 may be formed using a process step commonly known as the local oxidation of silicon (LOCOS). One of the primary limitations of the LOCOS process is the formation of a double-tapered "bird's beak" structure 5042 in FIG. 3. The present inventors, again, in a counter-intuitive insight, used what is normally thought of as a "process limitation" in an advantageous manner to produce a beneficial result. In particular, those of ordinary skill in the art will understand that in the LOCOS process, a diffusion barrier of silicon nitride is deposited and patterned such that predetermined regions are prevented from being thermally oxidized. The pattern limit of the silicon nitride corresponds to the dashed line 5040. However, during the oxidization process, the oxidant laterally diffuses to form the "bird's beak" structure 5042. Typically, this is an undesirable feature and "limits" the usage of LOCOS. Again, this process step is performed within the context of the standard AMIS ABN 1.5 µm fabrication process. Subsequently, the layer(s) of polysilicon 506(502) are deposited over the FOX material 304. The bird's beak structure is an advantageous feature because it is used to provide out-of-plane curvature for polysilicon layer 506.

When the field oxide is removed, the internal stresses are relieved such that the polysilicon layer(s) 506(502) flex upwardly and away from the substrate 200. This process of stressing/distressing results in a relatively rigid structure that resists the stiction forces that are introduced by the evaporation of the wet-etchant. Furthermore, when the resonator structure flexes upwardly, it further opposes the aforementioned stiction forces. This design feature advantageously increases the post-release yields of MEMS devices fabricated in accordance with the present invention.

It should also be noted that the resonator member formed by one or more layers (502, 504, 506) is positioned across the border formed by the FOX material and the gate oxide material 400. The region covered by gate oxide is commonly referred to as the active area because CMOS transistor devices may be disposed in this region in accordance with the integrated device design. In an embodiment of the present invention, a layer of silicide may be applied to one or more of the layers of polysilicon. As those of ordinary skill will appreciate, silicide contacts are typically formed in regions where metallic contacts are formed in direct contact with silicon. Silicide contacts are commonly employed in standard CMOS foundry processes as ohmic contacts for the source, drain and polysilicon gate. Typically, the silicide is a very thin (e.g., approximately, 3 nm) but is provides an electrically conductivity layer on the top of polysilicon. The silicide layer makes the resistivity of the gates of MOSFETs lower and thus increases the speed of the transistors. It is present all over the gate, not only under the contact areas. In many standard processes one can specify explicitly where the silicide is to be formed.

The process steps illustrated in FIG. 3A may be employed to fabricate a piezoresistive sensor that is comprised of a single polysilicon layer and silicide. In this embodiment, the silicide layer plays an important role. The resistance of polysilicon can be so high that the current propagating through it may be neglected in comparison to current propagating through the silicide. The silicide forms a thin, almost metallic layer, overtop of the polysilicon "insulator." This construction creates a classic bimorph piezoresistive sensor fabricated using a standard CMOS foundry process. Another benefit is that (i.e., in reference to FIG. 8A) one does not have to be concerned about a layer of interpoly oxide during the release.

In reference to dashed line 102, when the resonator member is configured as a substantially planar three-ply bridge structure (See FIG. 8B), the FOX material 304 is only removed in the direction to the right of line 102. The FOX material to the left of line 102 remains in place to support the planar bridge configuration.

Figure 3B:
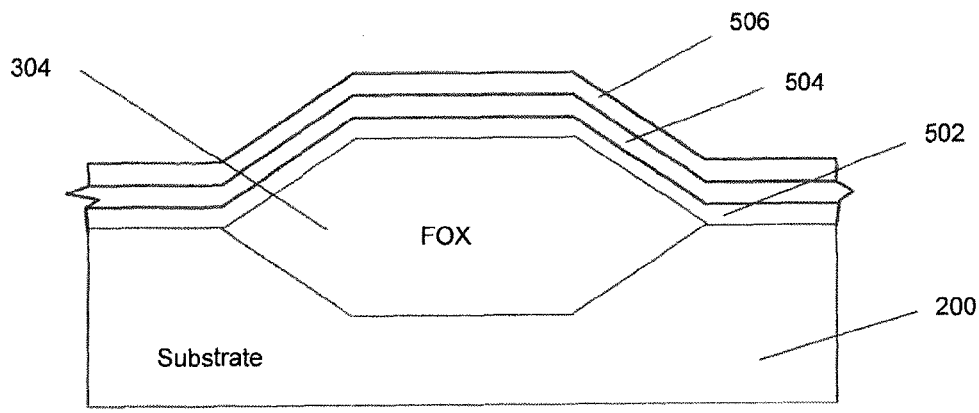

Referring to FIG. 3B, a detail view of a polysilicon film stack in accordance with another embodiment of the present invention is disclosed. In this embodiment, a three-ply polysilicon film stack is created. The film stack includes polysilicon layer 502, an interpoly oxide layer 504, and a an upper polysilicon layer 506. Again, a layer of silicide may be applied to one or more of the layers of polysilicon depending on the application. Once the standard foundry process is complete, the field oxide 304 is removed in accordance with the processes described above. At this point, the entire three-ply structure flexes outwardly and away from the substrate 200. Comparing the resonator structure of FIG. 3A with the one depicted in FIG. 3B, the latter is a three-ply structure that is characterized by a greater mass and a different stress. Those of ordinary skill in the art will understand that resonance is a function of both mass and stress. Thus, the ability to provide resonators having one, two, three, or four ply structures (i.e., including the silicide) is a tool that may be employed to predetermine the resonance of the resonator device.

Figure 3C:
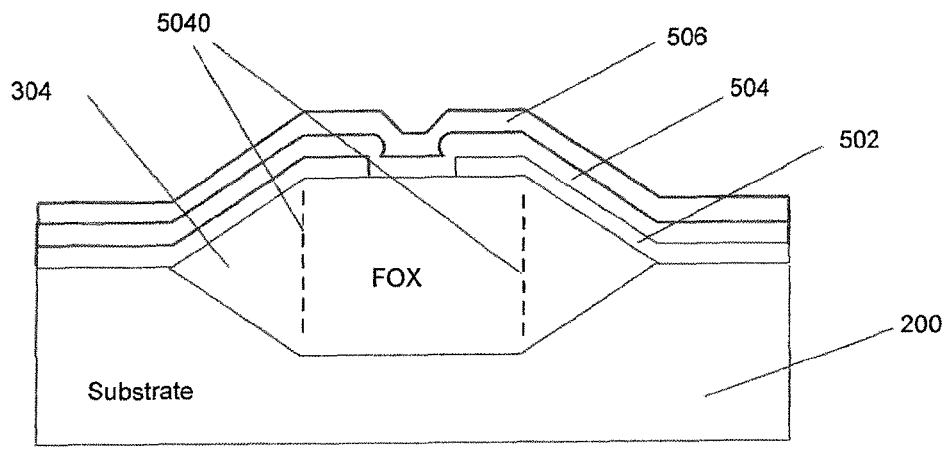

Referring to FIG. 3C, a detail view of a polysilicon film stack in accordance with another embodiment of the present invention is disclosed. In this embodiment, another three-ply polysilicon film stack is created. The film stack includes polysilicon layer 502, an interpoly oxide layer 504, and an upper polysilicon layer 506. During the patterning process steps of the lower polysilicon layer 502 during the standard CMOS foundry process, a central portion is removed to thereby expose a portion of the FOX material 304 underneath. A conformal coat of the interpoly oxide material 504 is subsequently deposited over the remaining portion of the polysilicon layer 504 and the exposed field oxide 304. At this point, the upper polysilicon layer 506 is conformally coated over the interpoly oxide layer 504. In the resonator release stage of the process, the FOX material 304 is left in place and a central portion of the interpoly oxide (substantially bounded by the dashed lines 5040) is removed to form another resonator embodiment. In this embodiment, polysilicon layer 502 may be patterned at one portion thereof as a heater element. Another portion of the polysilicon layer 502 may be patterned to form a lower capacitor plate and an electrode coupled to a contact portion 508 (See FIGS. 1 and 2). The interpoly oxide layer may have a thickness of approximately 400-600 angstroms (i.e., between 40-60 nm). The surface area of the remaining upper plate (i.e., polysilicon layer 506) may be on the order of approximately 80 microns. At this point, it is interesting to note another advantage of the present invention.

The Background of the invention notes that in the CMOS-MEMS processes that are under consideration, the size of the gap itself becomes a function of the linewidth of the illumination source in the photolithographic process. Accordingly, making the gap sufficiently small may become an expensive proposition. On the other hand, the present invention avoids the linewidth issue by using the sacrificial interpoly oxide layer to reduce the size of the gap. Another way to view the difference is to think of the previously considered method as using in-plane capacitive detection whereas the present invention employed "out-of-plane" capacitive detection.

Figure 3D:
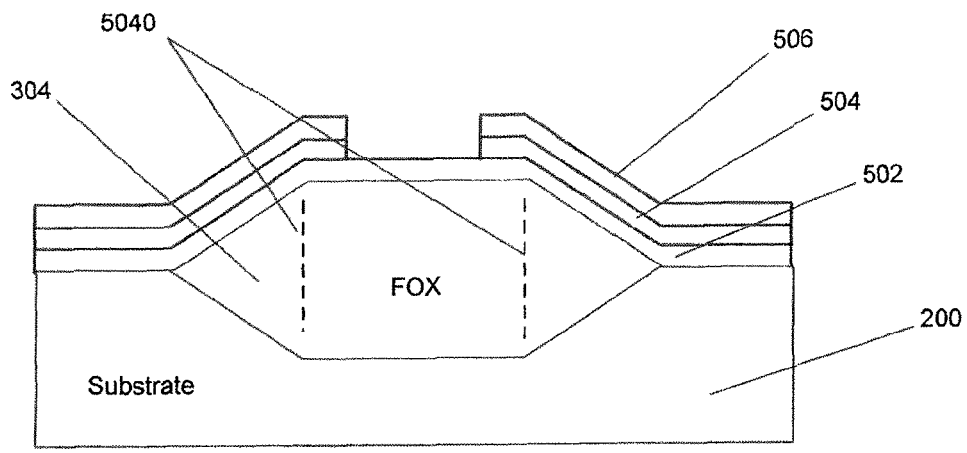

Referring to FIG. 3D, a detail view of a polysilicon film stack in accordance with another embodiment of the present invention is disclosed. In this embodiment, an aperture is formed in both the interpoly oxide layer 504 and the upper polysilicon layer 506 during one of the patterning processes of the standard CMOS, foundry process described above. Please note that the drawing is not to scale; the size of the aperture is typically on the order of several microns (in both directions in the X-Y plane). In this embodiment, a central portion of the interpoly oxide 504 (e.g., see dashed lines 5040) is removed. Portions of the FOX layer 304 may also be removed during the release step. This embodiment may be further customized by selectively removing predetermined portions of the either the FOX material 304 or the interpoly oxide material 504 to obtain desired performance criteria. For example, structure may be formed, such as columns or honeycombed regions, in either sacrificial layer to adjust or alter the resonance of the device.

In the three layer structures described herein, the use of an additional silicide layer is less important because the device is quite functional without it. However, the use of an additional layer of silicide would decrease the resistance of the sensor, bring it closer to 50 Ohms, and improve gauge factor. For the resonator dome embodiments of the present invention, the silicide may be employed to form relatively high conductivity areas for capacitive pick-up and drive, or for thermal drives.

In general, the techniques described in reference to FIGS. 3A-3D provide a sacrificial material layer under the resonator structure to facilitate out-of-plane flexing away from the substrate 200. When the devices are released, the compressive stress is relieved causing the devices to flex. It should also be noted that the curvature of the structure determines the way the compressive stress is released. Thus, the present inventors have counter-intuitively recognized that the internal stresses present in conformally coating polysilicon layers over the FOX 304 bird's beak structure may be advantageously employed to implement a high frequency, high Q-factor resonator structure. With the out-of-plane flexing feature, the upper polysilicon layer may be used as a resonator that vibrates out of plane and has a very large capacitance with respect to the lower polysilicon layer because the surface area of the capacitor plate is relatively large whereas the spacing is very small (e.g., approximately forty nanometers). Accordingly, the capacitively driven/detected devices of the present invention enable larger signals to be transmitted/received by the resonator.

The forced out-of-plane flexing also advantageously combats the stiction forces (as described in the Background) that are naturally present during the evaporation of the wet-etchant. As a result, the capacitively coupled resonator devices of the present invention may be made much larger in comparison to related art devices because the risk of stiction is significantly reduced or eliminated by virtue of the flexing action described above. Therefore, the out-of-plane flexing greatly increases post-release yield of the resonators. The inventors have observed yields greater than 90% without the need to employ critical point dry techniques. This last point leads directly to another efficient and cost-saving benefit of the present invention: no post-processing steps are required (other than the release of the resonators after the glass cut).

Finally, devices fabricated in accordance with the present invention may be designed to low intrinsic motional resistances (lower than 1 MOhm, down to near 50 Ohms) and input impedance near 50 Ohm (and without any reactive components), such that impedance matching between standard electronics and the resonator is facilitated.

Figure 4:
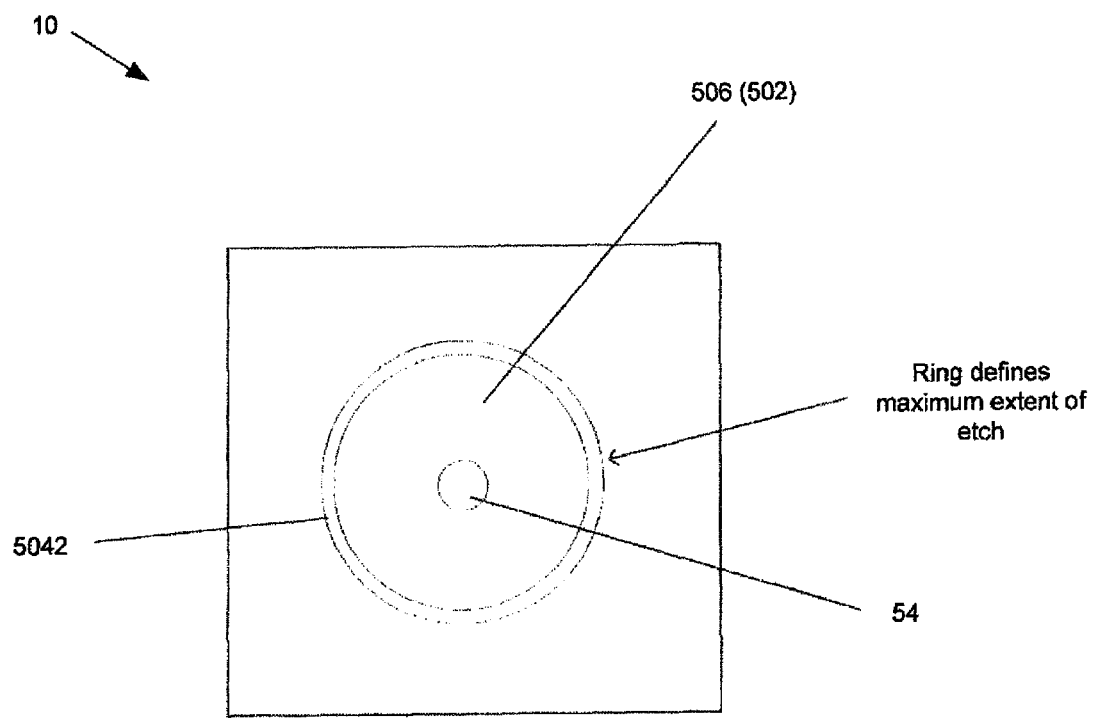
FIG. 4 is a plan view of a domed resonator structure fabricated in accordance with an embodiment of the present invention.

Referring to FIG. 4, a plan view of a domed resonator structure fabricated in accordance with an embodiment of the present invention is disclosed. In this view, polysilicon layer 506 forms the dome resonator and polysilicon layer 502 is disposed underneath. Like the embodiment depicted in FIG. 3C, the interpoly oxide layer 504 is removed to release the resonator structure. With the cross-sectional view of FIG. 3A firmly in mind, the plan view of FIG. 4 shows that the inner border of the opening formed by bird's beak 5042 defines the maximum area which can be affected by removal of the sacrificial interpoly oxide material 504. The cuts, therefore, serve to protect the remainder of the chip from being etched by whatever substance is used to remove the sacrificial layer (e.g., wet or vapor hydrofluoric acid, buffered oxide etch, etc.).

As embodied herein and depicted in FIG. 5, a detail perspective view of a resonator 10 fabricated in accordance with the methods depicted in FIGS. 1-4 is disclosed. FIG. 5, in fact, is a line drawing reproduction of a scanning electron micrograph of a dome structure designed and fabricated using the AMIS ABN 1.5 μm process. The overall dimension of the resonator 10 may be inferred by the 1 μm scale provided at the left-end of the drawing. The lower polysilicon layer 52 is selectively patterned by standard CMOS foundry process steps to implement (below the top polysilicon layer 56) both an integrated resistive heater (for driving the resonator) as well as an integrated capacitive detector (for sensing the motion of the polysilicon dome 56). The device exhibits high frequency and high quality factor, both features being desirable in resonator, oscillator, and sensing applications. While the illustrative example provided in FIG. 5 is directed to a thermally driven resonator, the upper layer 56 is free to resonate out-of-plane when excited by an electrical, capacitive, magnetomotive, thermal, or an optical drive stimulus. As shown in FIGS. 3A-3D, the design and fabrication techniques described herein can be extended to as many layers as is feasible to fabricate a resonating structure (the practical limits being the mass of the resonator, the total stress in the film stack defining the resonator, and the ease of releasing the resonator while preserving the inter-layer dielectrics that bind some or all of the mechanical resonator layers together).

It will be apparent to those of ordinary skill in the pertinent art that modifications and variations can be made to the resonator structure of the present invention depending on mechanical requirements of the resonator application. For example, the resonator may be formed using metallic layers (602, 702) in accordance with the layer map (See FIG. 1) of the standard foundry CMOS process being employed.

It will be apparent to those of ordinary skill in the pertinent art that modifications and variations can be made to both the drive circuit and the detection circuit employed herein depending on the application and requirements of the integrated device. For example, the drive circuit may be implemented as a thermal drive circuit, a capacitive drive circuit, an optical drive circuit or using a magnetomotive drive configuration. As those of ordinary skill in the art will appreciate, the magnetomotive drive configuration requires an external magnet. When the device is immersed in the magnetic field, a Lorenz force is applied to drive the resonator structure. In a capacitive drive circuit, the polysilicon layers are electrically isolated. In this case, the semiconductor substrate may also function as a lower plate. In any event, an AC signal is applied to create an electric field between the tow plates. The polarity of the electric field changes every half-cycle of the AC voltage signal causing the resonator to oscillate in response to the oscillating attractive force being applied thereto. As noted herein, the detection circuit may be implemented, as a capacitive detection circuit or as a piezoresistive detection circuit.

In reference to FIGS. 1-5 and the related text, the following design procedure is provided. The first step in the process is to acquire the design rules for the particular foundry process from the foundry or from a multi-project wafer institution that works with foundries. In the instant example, MOSIS is a multi-project wafer institution that the inventors have used in demonstrating the feasibility of the prototype devices disclosed herein. In selecting a given foundry and standard fabrication process, one must establish that the thin films (e.g., polysilicon) to be used as mechanical devices are conformally coated.

The next step in the process is to design the CMOS resonator structure with the CMOS circuitry in accordance with the system requirements. In this phase of the development, the mechanical specifications and the electrical specifications are defined. In this step, the mechanical structures must be designed with the mechanical properties of the thin film layer in mind. The film must have suitable mechanical properties for a resonating structure. As noted, polysilicon or metal materials have been found to perform adequately, but the present invention should not be construed as being limited to these materials.

In designing integrated mechanical driving elements such as resistive heaters or capacitive plates, these elements must be disposed in a suitable layer in the film stack. Further, these elements must be disposed in relatively close proximity to the MEMS/NEMS structure. In the examples provided herein, the lower polysilicon film 502 may be employed for both the drive and detection elements. The drive elements may be positioned within, directly under or within microns of the resonator structure. As explained in the detailed examples described above, the integrated mechanical sensing elements, such as capacitive plates or piezoresistive detectors, must also be disposed in a suitable layer proximate the mechanical structure in order to sense the motion of the MEMS resonator structure. The MEMS device is advantageously connected by the metalized layers to the CMOS electronics in the same integrated device such that the resonator or transducer signal may be amplified and other wise used by the electronics.

The device layout is accomplished with a computer aided design (CAD) tool. Subsequently, further simulations may be performed to determine if the device meets specifications. In following the very general procedure delineated above, one would follow the standard recipe in the design process in accordance with standard film stack layout (See FIGS. 1 and 2) and standard foundry design rules. The resultant design is then submitted to the foundry. At this point it is interesting to note that because the foundry is following the standard foundry recipe, it has no idea that the integrated devices that it producing includes MEMS structures. The designer simply receives the functional integrated CMOS device (having micromechanical resonators) from the foundry. While this may appear to be a small thing, the simplicity of the design/foundry interface is one of the elegant features of the process. There is no pre-MEMS processing, no post-MEMS processing, and no MEMS-in-the-middle processing that the foundry need be aware of. The entire process is transparent and the foundry efficiently carries on by performing its typical low cost batch processes. The structures so created are, advantageously, CMOS-integrated versions of what previously were stand-alone micromechanical or nanomechanical structures.

During the CAD layout process, the designer must take care to establish that the field oxide forms the double-tapered "bird's beak" structure. Other forms may be employed, but the field oxide 304 must otherwise extend outwardly from the underlying substrate. Essentially, the field oxide should not be planarized. In reference to FIG. 3A, in particular, a circular depression may be formed in the substrate 200 by using a certain combination of layers in the CAD design. During fabrication, a part of the wafer is either masked using photoresist such that the material does not fill in the region of the desired depression. Alternatively, the region of the desired depression is exposed while everything else is masked during an etch step (that is, a subtractive process is enabled). The shape is determined by the photolithography and is clearly specified by the CAD.

The slope of the bird's beak is somewhat more difficult because one must be aware of the properties of the oxidant and the time it takes to oxidize the substrate. The removal of the field oxide at the edges of the mechanical structure must be designed such that the bird's beak is symmetrical. In reference to FIG. 3A, the distance from the top surface of layer 304 to the midpoint of line 5040 should be substantially the same as the distance from the under-surface of layer 506(502) to the midpoint of line 5040. The release etchant must be prevented from over-etching material away from the mechanical structure.

In concluding the discussion of the method of designing and fabricating integrated CMOS-MEMS devices in accordance with the present invention, it must be noted that one of the most important features of a resonator is the Quality factor (Q-factor) of the device. Many of the steps described above have an impact on the Q-factor, and therefore, it may be helpful to discuss these issues and their impact on the Q-factor. The Q-factor is primarily a function of the resonator material. The inventors of the present invention have found that the Q-factor of polysilicon-made resonators may exceed 10,000. Resonators having a Q-factor between 100 and 1,000 are routine. The next most important issue is to ensure that the resonator is rigidly clamped at the hinge region 5044 (See FIG. 3). Furthermore, release etching must be carefully performed to eliminate stiction (i.e., all of the possible points wherein the resonator layer 56 might possibly touch and stick to the substrate 52 or 200 must be eliminated). As described in detail above, the combination of the dome curvature and built-in stress is also an important feature of the present invention that substantially eliminates or obviates the stiction issue. The suspended dome structure 56 is flexed upwardly from the bird's beak at the release stage of the process. The release also opens up the anchoring hinge points (5044) such that there is no mechanical contact between the upper polysilicon layer 506 and the lower polysilicon layer 502 (or silicon substrate 200).

Figure 6:
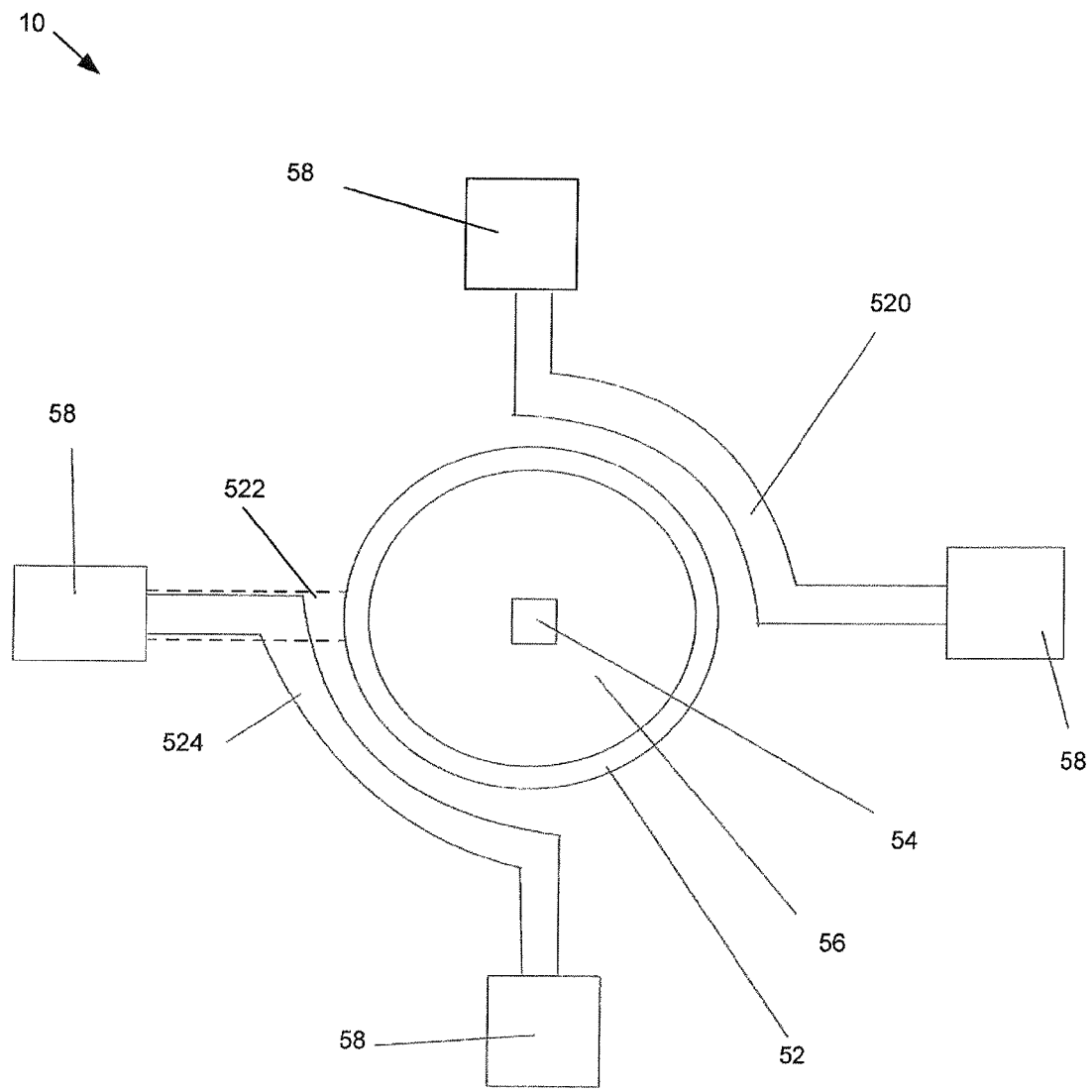
FIG. 6 is a plan view of a MEMS resonator in accordance with an embodiment of the present invention.

Referring to FIG. 6, plan view of a MEMS resonator in accordance with an embodiment of the present invention is disclosed. In the embodiment depicted herein, both polysilicon layers (52, 56) are used to implement the device. The CMOS-MEMS resonator device 10 depicted herein uses the upper polysilicon layer 56 as a domed resonator and patterned portions of the lower polysilicon layer 52 are employed as a resistive heating element 520. The resistive heating element 520 extends between a contact 58 disposed at the "three O'clock" position and a second contact 58 disposed at the twelve O'clock position. In another embodiment, the heater element 520 may be implemented as a conductive path disposed in the resonating dome 56. The heater element is driven by an AC current at the resonance frequency of the polysilicon dome 56. Any suitable resistor structure may be used as a heater element. The resistor, of course, dissipates electrical energy as heat ($I^2R$). If the signal applied to the resistor (heater) is applied at the resonance frequency of the resonator, and the heater is in relatively close proximity to the resonator (as shown in FIGS. 5 and 6), then the resonator will experience a local change in the material characteristics (e.g., density, Young's modulus, etc.) of the resonator. By propagating a current through the heater a localized "hot spot" is created (i.e., the application of thermal energy is non-homogeneous). Due to thermal expansion at the local hot spot, the local region expands such that the entire structure is slightly distorted. An AC current signal propagates through the resistive element in order to produce alternate heating and cooling cycles at the mechanical resonant frequency such that resonator structure 56 begins to vibrate at the resonant frequency. The resonant frequency of the dome is a function of the dome geometry, young's modulus, thickness, radius, (length and width for other structures), and mass. The amplitude of the mechanical vibrations is approximately 5 nm or less.

The oscillating mechanical vibrations of the resonator dome 56 are detected by an integrated capacitive detector 522 (see dashed line) that is formed by a patterned portion of the lower polysilicon layer 52 that extends between the contact 58 disposed at the nine O'clock position and a substantially circular patterned portion of the polysilicon layer 52 disposed under resonator dome 56. A D.C. bias is applied across the upper polysilicon layer 56 and the bottom polysilicon layer 52 to create an electric field therebetween. The portion of the polysilicon layer 52 disposed under the dome 56 functions as the capacitive sensor. Because the sensor layer 52 and the resonator dome 56 have a constant area, any change in capacitance must be a result of a change in the distance between the plates (52, 56) of the capacitor (i.e., those of ordinary skill in the art will understand that capacitance is a function of area, distance and the dielectric material between the plates). The change in capacitance results in a voltage signal being directed to the CMOS electronics (not shown in this view) via contact 58. Capacitive detection generally results directly in a voltage signal. However, in an alternate embodiment, a current signal may be employed. A current signal, of course, is easily converted into a voltage using a simple resistor. Capacitive detection provides a signal having a frequency that corresponds to the resonance frequency. As noted above, due to the large surface area of the capacitor, i.e., $(\pi)(5 \ \mu m)^2 \approx 80 \ \mu m^2$, a relatively large output signal is provided to the on-chip electronics.

Using the parallel plate capacitor model, the output current is $I(t)=dq(t)/dt=VdC(t)/dt$. The bias voltage "V" is, in one embodiment, about 4 volts. Using the parallel plate capacitor model $C=\in A/d$, where A is the area of the parallel plates, d is the gap between the plates, and $\in$ is the dielectric permittivity of the material between the plates. Therefore, the output current is preoperational to the bias voltage V and inversely proportional to the gap d. Thus, it is important to minimize the gap distance "d." In one embodiment discussed above, the gap distance is about 50 nm. In any event, an output signal is provided by the integrated capacitive detector 60 to the CMOS electronics via contact 58.

In an alternate embodiment, an exemplary detection circuit conductor 524 extends between the contact 58 disposed at the nine O'clock position and the contact 58 disposed at the six O'clock position. The size of the dome structure provides a spatial separation, and hence electrical isolation, between the detection conductor 522 and the drive conductor 520 such that the conductors 520 and 522 may be disposed immediately adjacent to, or directly implanted in the domed structure 56 itself. In one standard CMOS foundry process, the polysilicon layers may be doped using N-type doping material or P-type doping material. Accordingly, one conductor implanted within the dome 56 may be an N-type polysilicon and the other P-type to provided further isolation.

In yet another alternate embodiment of the device depicted in FIG. 6, an additional silicide layer may be employed for the reasons described above. For the resonator dome embodiments depicted herein, the silicide may be used to implement relatively high conductivity areas for capacitive pick-up and drive, or for thermal drives.

The devices described herein are capacitively detected without the need of a matching circuit to transform the resonator impedance to the 50Ω input impedance of standard radio frequency (RF) electronics. All of these features enable MHz frequency, high quality factor, mechanical resonator devices which are simple to design and fabricate and are effectively driven and detected using standard electrical techniques.

Figure 7:
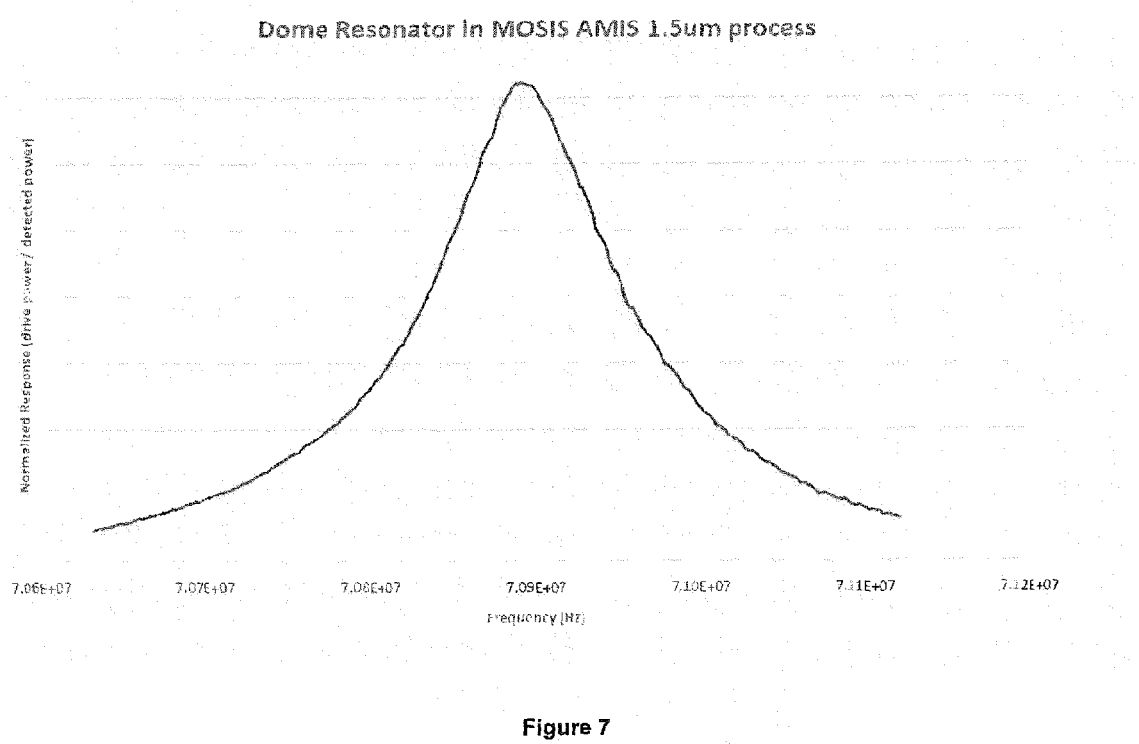
FIG. 7 is a graphical plot illustrating the performance of the MEMS resonator fabricated in accordance with an embodiment of the present invention.

FIG. 7 is a graphical plot illustrating the performance of a MEMS resonator fabricated in accordance with the methods described herein. The plot is normalized output (output power/drive power) versus frequency. The plot has a substantially Gaussian shape and shows that the device resonates at approximately 70.9 MHz such that the normalized output reaches its peak at that frequency. The measured device, therefore, is shown to be suitable for RF applications such as filters, mixers, and reference oscillators. Again, the measured device is driven using an integrated heater drive (in the lower polysilicon film 52) and capacitive detection (also in the lower polysilicon film 52). The experiment was performed at a pressure of about 100 mTorr. These devices typically exhibit relatively high quality factors (typically greater than 1,000), making them advantageous in applications requiring narrow bandwidth filtering or high precision reference and timing. Sensor applications may also be possible given the high quality factor and likely high frequency stability and mass sensitivity. The design methodology presented herein enables all of these structures to be manufactured in a standard CMOS process.

Figure 8A:
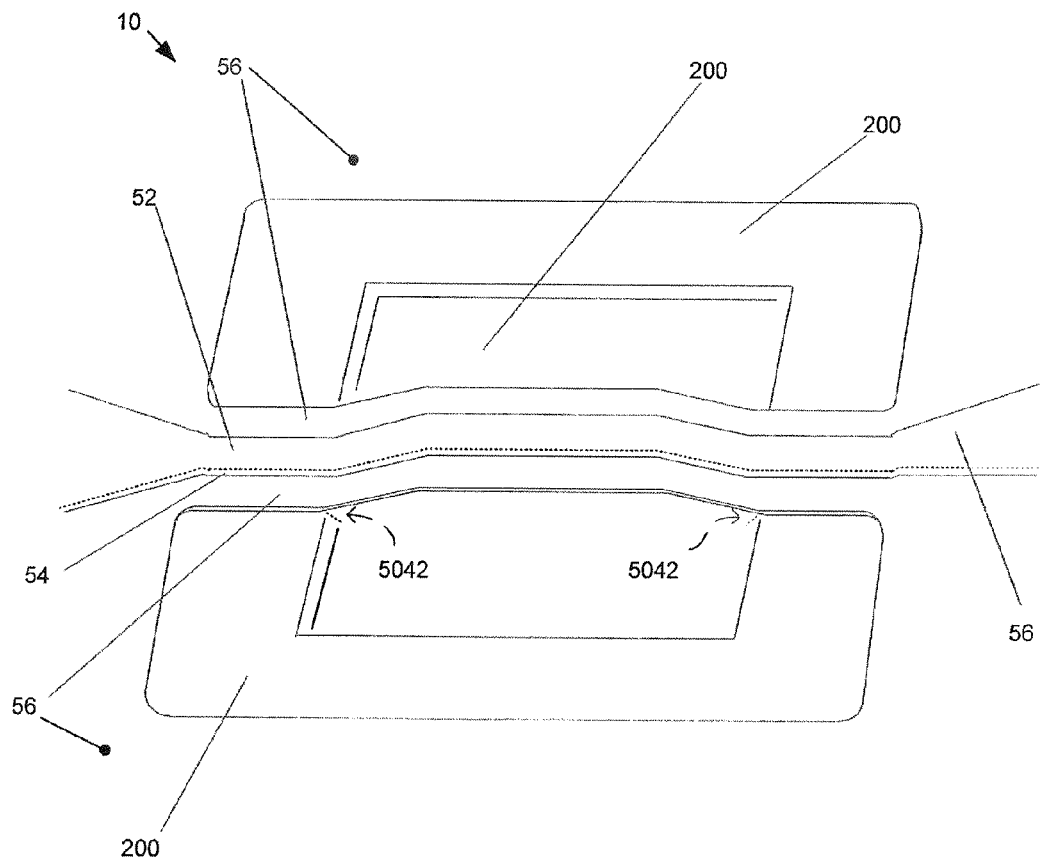
FIGS. 8A-8B are alternate embodiments of resonator structures fabricated in accordance with other embodiments of the present invention.

Referring to FIG. 8A, an alternate embodiment of a resonator structure 10 fabricated in accordance with another embodiment of the present invention is disclosed. In this embodiment, an arched bridge structure 10 is disclosed. The bridge 10 includes a relatively narrow polysilicon layer 52, an interpoly oxide layer 54, and a relative wide upper polysilicon layer 52. In FIG. 8A, the dashed line along the bridge structure indicates that the narrow polysilicon spine 52 and the interpoly oxide layer 54 are disposed underneath the relatively wide upper polysilicon layer 56 which conformally coats the entire region with the exception of the exposed silicon substrate 200 areas as shown. This three-ply structure may correspond to the methods disclosed in FIGS. 3A and 3B.

In general, the field oxide material is removed to release the bridge structure such that it flexes upwardly to form the bird's beak 5042 at either end thereof. The removal of the FOX 304 also creates a substantially rectangular depression under the bridge 10. In particular, when the FOX material 304 is disposed under and around the bridge, it protects the interpoly oxide layer 54 disposed between the upper and lower polysilicon layers (52, 56) from being etched until the majority of the FOX material is removed and the bridge is almost released. In order to prevent the etchant material from removing the interpoly oxide layer 54, glycerol may be added to either the HF or BOE etchant to increase the viscosity of the etchant. The relatively viscous etchant has no difficulty removing the FOX material in the approximately one micron gap between the underside of the bridge and the bottom of the depression. On the other hand, the viscous etchant has great difficulty in getting between the two polysilicon layers to remove the interpoly oxide and the interpoly oxide remains intact after the release step is performed. As such, the bridge structure is a three-ply or tri-layer resonator device.

In another alternate embodiment, the three layer structure depicted in FIG. 8A may be configured to include a layer of silicide in accordance with the description provided above. Again, the use of an additional silicide layer is less important in the three layer (52, 54, 56) device because the device is quite functional without it. However, the use of an additional layer of silicide would decrease the resistance of the sensor, bring it closer to 50 Ohms, and improve gauge factor.

The three-layer and four layer resonator devices depicted herein may be configured as piezoresistive transducers. As the piezoresistive structure resonates, all three layers vibrate together. The resistance of the polysilicon layers modulates in accordance with the resonant frequency. In practice, only one of the polysilicon layers is measured. Those of ordinary skill in the art will understand that when a current propagates through a resistor a predetermined voltage in accordance with Ohm's law (V=IR) is generated. If the resistance is a periodic function of time, the resulting voltage output will be also.

In an alternate embodiment of the present invention, the process steps illustrated in FIG. 3A may be employed to fabricate a piezoresistive sensor that is comprised of a single polysilicon layer and a layer of silicide. In this embodiment, the silicide layer plays an important role. The resistance of polysilicon can be so high that the current propagating through it may be negligible in comparison to current propagating through the silicide. The silicide forms a thin, almost metallic layer, overtop of the polysilicon "insulator." This construction creates a classic bimorph piezoresistive sensor fabricated using a standard CMOS foundry process. Another benefit is that one does not have to be concerned about a layer of interpoly oxide during the release.

Figure 8B:
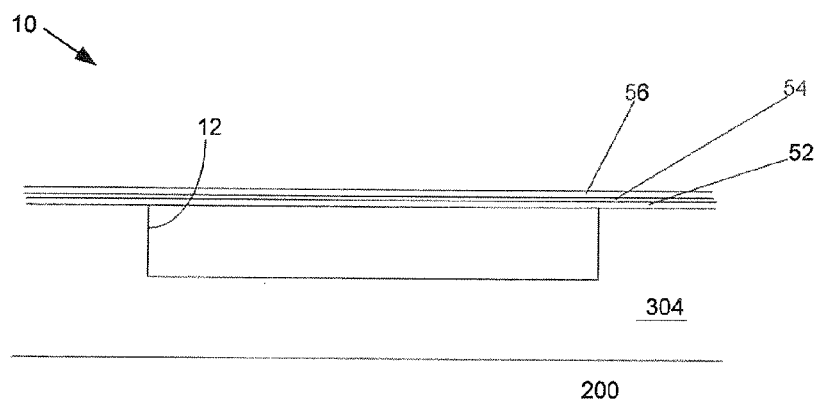

Referring to FIG. 8B, a substantially planar bridge structure 10 is disclosed. In this embodiment, the three-ply planar bridge is created by removing the FOX material 304 inboard from the bird's beak (see reference line 102 in FIG. 3A). This structure may also be employed as a piezoresistive device. Like the embodiments depicted in FIG. 8A, the embodiment of FIG. 8B may also include the additional silicide layer at least for reasons provided above.

Figure 9A:
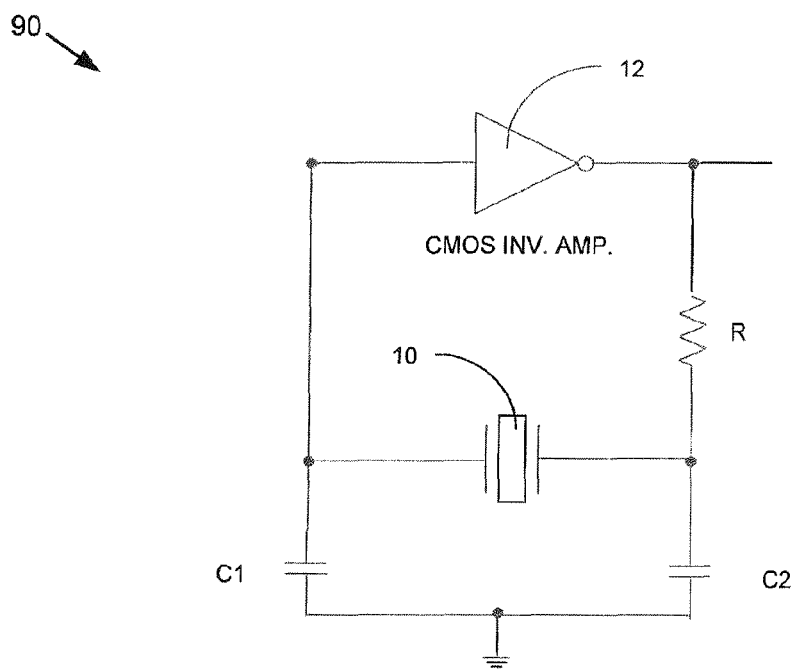
FIGS. 9A and 9B are CMOS oscillator devices fabricated in accordance with the methods depicted in FIGS. 1-4.
Figure 9B:
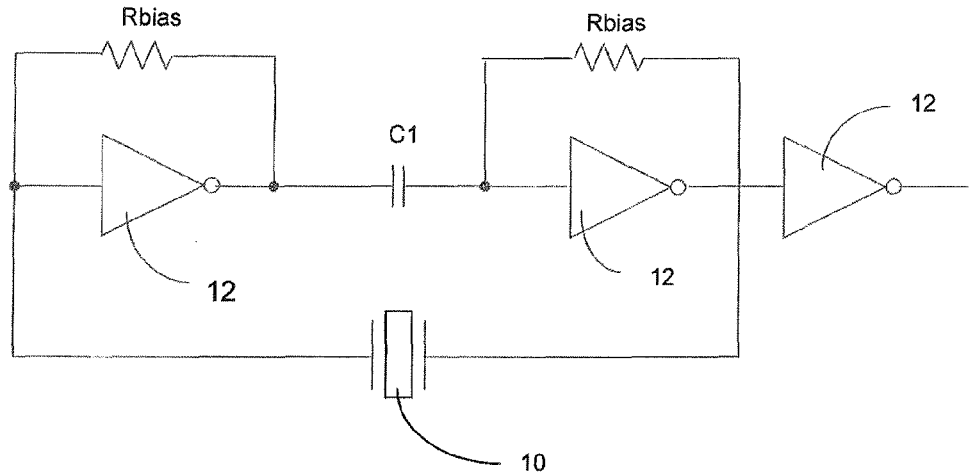

FIGS. 9A and 9B are CMOS oscillator devices fabricated in accordance with the methods described herein. In FIG. 9A, the CMOS-MEMS resonator device 10 previously described is employed in the Pierce oscillator circuit 90. As those of ordinary skill in the art will understand, the inverter 12 may be implemented using a p-type insulated gate field-effect transistor in combination with a complementary n-type field-effect transistor to provide a relatively large output signal. Reference is again made to U.S. Pat. No. 3,356,858, which is incorporated herein by reference as though fully set forth in its entirety, for a more detailed explanation of a basic CMOS inverter. The circuit itself is relatively unimportant in and of itself, and is used herein merely to illustrate that the resonator of the present invention may be employed in the CMOS device in a variety of ways. As a further example, FIG. 9B shows a two-inverter oscillator 95. Each inverted includes a biasing resistor $R_{bias}$. The resistors bias the inverted between a logic one and logic zero state and are employed to help the inverted amplify when power is applied. Again, the circuit itself is relatively unimportant in and of itself, and is used herein merely to illustrate that the resonator of the present invention may be employed in the CMOS device in a variety of ways.

The present invention should be construed as being limited to the example circuits depicted in FIG. 9A and FIG. 9B. Instead, those of ordinary skill in the art will understand that the present invention is directed to the fabrication of MEMS/NEMS resonator devices alongside active and passive electronic elements using standard, unmodified CMOS foundry processes. This aspect of the present invention differs from the CMOS-MEMS integration methods described in the Background of the invention for all of the reasons provided herein.

In yet another embodiment of the present invention, the dome resonators depicted in FIGS. 4-6, the bridge structures depicted in FIGS. 8A-8B, or a modified structure, such as a cantilevered beam (i.e., one end of the bridge is detached and the bird's beak is formed at the other), may be "functionalized" by coating it with a polymer film or some other chemically reactive film that is configured to capture predetermined biological or chemical agents such as anthrax spores, etc. When a molecule or a spore is captured by the film, the overall mass of the bridge or beam is changed. The piezoresistive resonator described above, therefore, measures the change in mass by detecting the change in the resonant frequency of the bridge due to the added mass. The beams have a chemical selective film at the end of the cantilever that reacts or absorbs the chemical to be sensed. The additional mass is detected in a change in resonant frequency.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A method for making a CMOS integrated micromechanical device, the method comprising:
   a.) selecting a standard CMOS foundry fabrication process, the standard CMOS foundry fabrication process being characterized by a predetermined layer map and a predetermined set of fabrication rules;
   b.) providing a semiconductor substrate in accordance with the predetermined layer map and the predetermined set of fabrication rules;
   c.) forming a layer of field oxide material over the semiconductor substrate in accordance with the predetermined layer map and the predetermined set of fabrication rules, the field oxide material forming a double-tapered profile around a predefined perimeter;
   d.) conformally coating the field oxide material with at least one layer of thin-film material to form a film-stack in accordance with the predetermined layer map and the predetermined set of fabrication rules, the film stack being configured as a MEMS resonator device;
   e.) forming CMOS electronics elements in accordance with the predetermined layer map and the predetermined set of fabrication rules, the steps c-e not being necessarily performed sequentially, the steps c-e being performed during the standard CMOS foundry fabrication process; and
   f.) removing the field oxide layer or an interpoly oxide layer to form a MEMS resonator device after steps c-e are completed, the step of removing being configured to release the MEMS resonator device such that at least a portion of the MEMS resonator device flexes upwardly and away from the semiconductor substrate in conformance with the double-tapered profile, the MEMS resonator device being characterized by a predetermined mechanical resonance frequency.

2. The method of claim 1, wherein the step of forming CMOS electronics elements includes forming a drive circuit coupled to the MEMS resonator device, the drive circuit being configured to drive the MEMS resonator device into resonance.

3. The method of claim 2, wherein the drive circuit is selected from a group of drive circuits that includes a thermal drive circuit, a capacitive drive circuit, an optical drive unit, or a magnetomotive drive configuration.

4. The method of claim 3, wherein the drive circuit is configured to apply an AC signal.

5. The method of claim 1, wherein the step of forming CMOS electronics elements includes forming a detection circuit coupled to the MEMS resonator device, the detection circuit being configured to detect vibrations generated by the MEMS resonator device and provide an electrical output signal corresponding to the detected vibrations.

6. The method of claim 5, wherein the detection circuit is selected from a group of detection circuits including a capacitive detection circuit or a piezoresistive detection circuit.

7. The method of claim 5, wherein the step of forming CMOS electronics elements includes forming a CMOS oscillator circuit, the CMOS oscillator circuit including the MEMS resonator device coupled to a CMOS amplifier.

8. The method of claim 1, wherein the MEMS resonator device includes a CMOS-MEMS piezoresistive transducer.

9. The method of claim 1, wherein the at least one layer of thin-film material includes an upper layer of polysilicon material, an interpoly oxide layer, a lower layer of polysilicon material, and a layer of silicide disposed over at least one of the upper layer of polysilicon material and the lower layer of polysilicon material.

10. The method of claim 9, wherein the step of conformally coating includes depositing the lower layer of polysilicon material over the layer of field oxide material, forming the interpoly oxide layer over the lower layer of polysilicon, and depositing the upper layer of polysilicon over the interpoly oxide layer to form a double-polysilicon film stack.

11. The method of claim 10, wherein the step of conformally coating includes the step of forming an aperture in a major surface of the upper layer of polysilicon material or forming an aperture in both a major surface of the upper layer of polysilicon material and an underlying portion of the interpoly oxide layer.

12. The method of claim 11, wherein the step of removing includes removing a portion of the interpoly oxide layer between the upper layer of polysilicon and the lower layer of polysilicon to form a MEMS dome resonator.

13. The method of claim 12, wherein a distance between the upper layer of polysilicon material and the lower layer of polysilicon material after the step of removing is less than or equal to about 200 nm.

14. The method of claim 12, wherein a distance between the upper layer of polysilicon material and the lower layer of polysilicon material after the step of removing is approximately 40 nm.

15. The method of claim 9, wherein the double-polysilicon film stack is configured as a domed MEMS resonator having a predetermined quality factor.

16. The method of claim 15, wherein the domed MEMS resonator is characterized by a substantially circular shape in plan view.

17. The method of claim 16, wherein the predefined perimeter forms a diameter that is less then or equal to about 20 microns.

18. The method of claim 15, wherein the predetermined quality factor exceeds 100 and the resonance frequency exceeds 1 MHz.

19. The method of claim 15, wherein the step of forming CMOS electronics elements further comprises:
   forming a drive circuit coupled to the domed MEMS resonator, the drive circuit being configured to drive the domed MEMS resonator into resonance; and
   forming a capacitive detection circuit coupled to the domed MEMS resonator, the capacitive detection circuit being configured to detect vibrations generated by the domed MEMS resonator and provide an electrical output signal corresponding to the detected vibrations.

20. The method of claim 19, wherein the drive circuit includes a drive circuit conductive path formed in the domed MEMS resonator or adjacent thereto, and wherein the detection circuit includes a detection circuit conductive path formed in the domed MEMS resonator or adjacent thereto, the drive circuit conductive path and the detection circuit conductive path being electrically isolated from each other.

21. The method of claim 20, wherein the drive circuit is selected from a group of drive circuits that includes a thermal drive circuit, or a capacitive drive circuit, or a magnetic drive configuration.

22. The method of claim 20, wherein the detection circuit is selected from a group of detection circuits including a capacitive detection circuit or a piezoresistive detection circuit.

23. The method of claim 19, wherein the step of forming CMOS electronics elements includes forming a CMOS oscillator circuit, the CMOS oscillator circuit including the MEMS resonator coupled to a CMOS amplifier.

24. The method of claim 15, further comprising the step of coating the domed MEMS resonator with a chemically or biologically reactive material to thereby form a chemical or biological sensor.

25. The method of claim 9, wherein the step of conformally coating includes the step of patterning the lower layer of polysilicon material, the interpoly oxide layer and the upper layer of polysilicon to form a bridge-shaped structure over the field oxide material.

26. The method of claim 25, wherein the step of removing includes removing the field oxide material to thereby release the bridge structure.

27. The method of claim 25, wherein the bridge-shaped structure is configured as a piezoresistive sensor configured to detect vibrations in the bridge structure.

28. The method of claim 25, further comprising the step of coating the bridge structure with a chemically or biologically reactive material to thereby form a chemical or biological sensor.

29. The method of claim 25, wherein the drive circuit includes a drive circuit conductive path formed in the bridge-shaped structure or adjacent thereto, and wherein the detection circuit includes a detection circuit conductive path formed in the bridge-shaped structure or adjacent thereto, the drive circuit conductive path and the detection circuit conductive path being electrically isolated from each other.

30. The method of claim 1, wherein the step of conformally coating includes depositing a layer of polysilicon material over the layer of field oxide material and the step of removing includes removing the field oxide layer to form a one-ply resonator structure, the layer of polysilicon material optionally including a layer of silicide disposed thereon.

* * * * *

UNITED STATES PATENT AND TRADEMARK OFFICE
CERTIFICATE OF CORRECTION

PATENT NO. : 8,704,315 B2
APPLICATION NO. : 13/000650
DATED : April 22, 2014
INVENTOR(S) : Jeevak M. Parpia et al.

Page 1 of 1

It is certified that error appears in the above-identified patent and that said Letters Patent is hereby corrected as shown below:

In the Claims

Column 19, claim 9, line 65, "and" should include "/or." Therefore, the wording should appear as "and/or."

Signed and Sealed this
Second Day of September, 2014

Michelle K. Lee
*Deputy Director of the United States Patent and Trademark Office*